(12) United States Patent
Cheng et al.

(10) Patent No.: US 8,339,806 B2
(45) Date of Patent: Dec. 25, 2012

(54) NETWORK COMMUNICATION COMPONENT

(75) Inventors: Ching-Yuan Cheng, Taoyuan Hsien (TW); Chen-Jung Chen, Taoyuan Hsien (TW)

(73) Assignee: Delta Electronics, Inc., Kuei San, Taoyuan Hsien (TW)

(*) Notice: Subject to any disclaimer, the term of this patent is extended or adjusted under 35 U.S.C. 154(b) by 254 days.

(21) Appl. No.: 12/719,518

(22) Filed: Mar. 8, 2010

(65) Prior Publication Data

US 2011/0155454 A1    Jun. 30, 2011

(30) Foreign Application Priority Data

Dec. 24, 2009  (TW) ............................. 98144634 A

(51) Int. Cl.
*H05K 9/00*    (2006.01)

(52) U.S. Cl. ..................... 361/816; 361/818; 361/730

(58) Field of Classification Search ............... 361/760, 361/720, 748, 799, 816, 818, 800, 728–730, 361/752, 796; 312/223.1, 223.2
See application file for complete search history.

(56) References Cited

U.S. PATENT DOCUMENTS

| | | | | |
|---|---|---|---|---|
| 3,506,877 | A * | 4/1970 | Owen | 361/715 |
| 4,325,103 | A * | 4/1982 | Ito et al. | 361/816 |
| 4,841,414 | A * | 6/1989 | Hibino et al. | 361/818 |
| 6,688,915 | B2 * | 2/2004 | Moriwake et al. | 439/607.05 |
| 6,946,942 | B1 * | 9/2005 | Chih-Min | 336/90 |
| 7,042,529 | B2 * | 5/2006 | Wakamori et al. | 348/836 |
| 7,241,181 | B2 * | 7/2007 | Machado et al. | 439/676 |
| 7,326,084 | B1 * | 2/2008 | Chen et al. | 439/620.23 |
| 7,948,771 | B2 * | 5/2011 | Zhang et al. | 361/809 |
| 2005/0282441 | A1 * | 12/2005 | Murr et al. | 439/676 |

* cited by examiner

*Primary Examiner* — Hung S Bui
(74) *Attorney, Agent, or Firm* — Muncy, Geissler, Olds & Lowe, PLLC

(57) ABSTRACT

A network communication component includes a case, a plurality of channels and at least one shielding. The channels are formed in the case. The shielding is disposed between two adjacent channels. Through the shielding between the channels, mutual interferences between the channels are avoided to enhance the signal communication quality.

18 Claims, 4 Drawing Sheets

NETWORK COMMUNICATION COMPONENT

CROSS REFERENCE TO RELATED APPLICATIONS

This Non-provisional application claims priority under 35 U.S.C. §119(a) on Patent Application No(s). 098144634 filed in Taiwan, Republic of China on Dec. 24, 2009, the entire contents of which are hereby incorporated by reference.

BACKGROUND OF THE INVENTION

1. Field of Invention

The invention relates to a network communication component and, in particular, to a network communication component, a network filtering component and a network connector for enhancing signal communication quality.

2. Related Art

In this age, network communication has become an indispensable element of our daily life, and the network communication component, such as a network connector or a network filtering component, plays an important role in the architecture of the network communication system. Among these components, the network connector connects the terminal for transmitting the signals from the terminal to the network or from the network to the terminal. Besides, the signal noises are filtered by the network filtering component. These network communication components have a plurality of channels to transmit signals.

With the development of hardware technology, signal transmission speed of the network becomes faster and faster. In this trend, signal noises will be raised due to the rising of operating frequency, which makes mutual interferences between the channels more serious.

SUMMARY OF THE INVENTION

In view of the foregoing subject, an object of the invention is to provide a network communication component, a network filtering component and a network connector for avoiding the interference between the channels to enhance signal transmission quality.

To achieve the above object, the invention discloses a network communication component including a case, a plurality of channels formed in the case, and at least one shielding disposed between two adjacent channels.

The network communication component further includes at least one pin and a filtering element. Preferably, the pin is L-shaped or gull-wing-shaped. The filtering element includes a metal core wound with a coil for converting energy or filter signals.

The case has at least one partition to separate the channels, wherein the partition has a hole, and the shielding is inserted in the hole. The shielding is coupled with the partition by welding, adhering, wedging, embedding or injection molding.

The network communication component further includes a connection element for being connected to the shielding, wherein the shielding and the connection element are formed as one monolithic piece, wedged to each other, adhered to each other, welded to each other or formed by stamping. The case is connected with the shielding and the connection element by embedding or assembling.

Preferably, the connection element has a grounding portion protruded out of the case and electrically connected with a circuit board.

Preferably, the shielding has a grounding portion protruded out of the case and electrically connected with a circuit board. The grounding portion is wedged or welded to the circuit board.

Preferably, the case is coupled with the shielding by embedding or assembling.

The network communication component is a network filtering element, a network connector or an electronic device applied to network communication.

There is a pin, a filtering element, a passive device, an active device or their combination disposed in the channel.

Preferably, the shielding is made of metal, alloy or conductive polymer. The shielding has a sheet shape or an irregular shape, or has a bent portion or a curved portion. The shielding contacts with the case or a grounding point.

As mentioned above, by disposing the shielding between two adjacent channels, the network communication component of the invention can avoid mutual interferences between channels to enhance signal transmission quality as well as the product competiveness.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 1A:
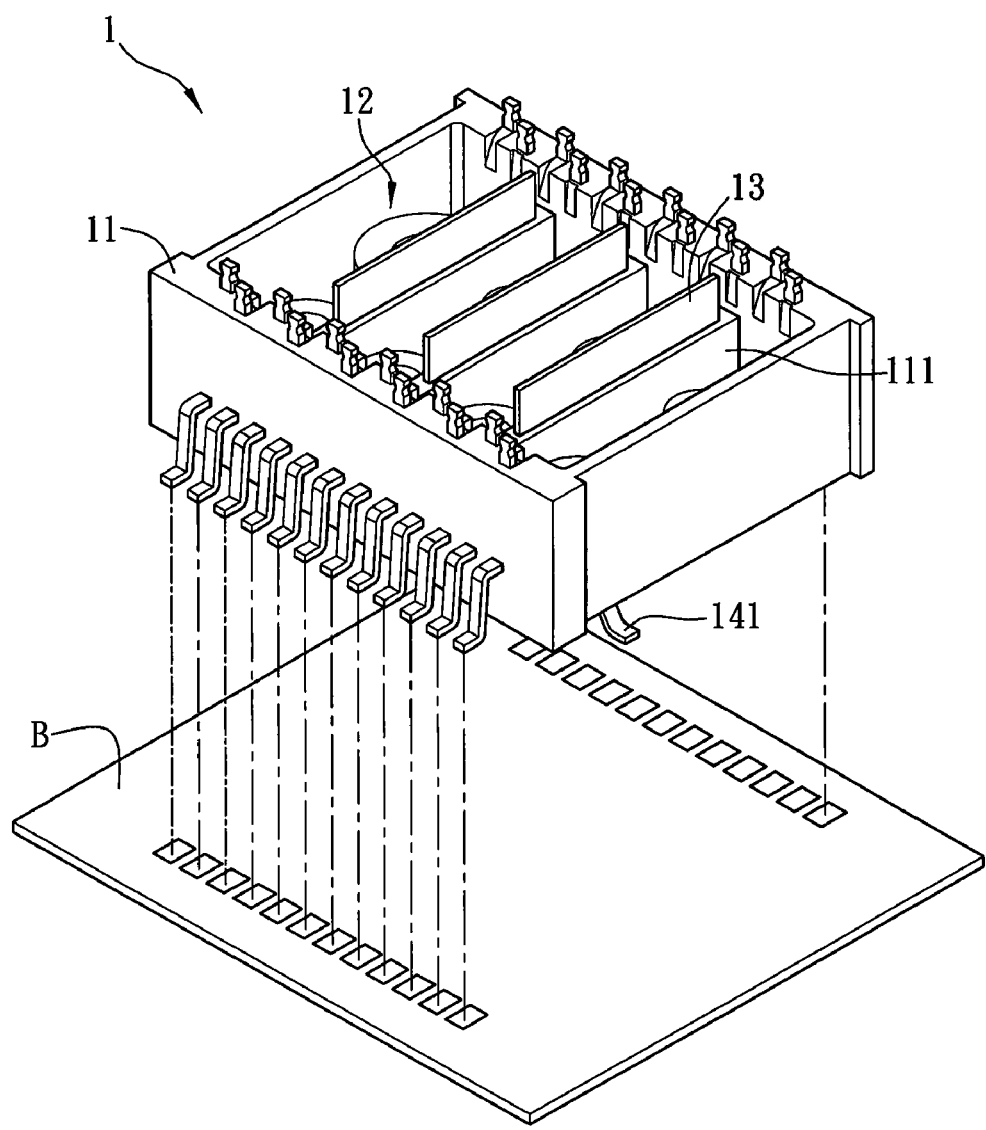
FIGS. 1A and 1B are schematic diagrams of a network communication component according to an embodiment of the invention.
Figure 1B:
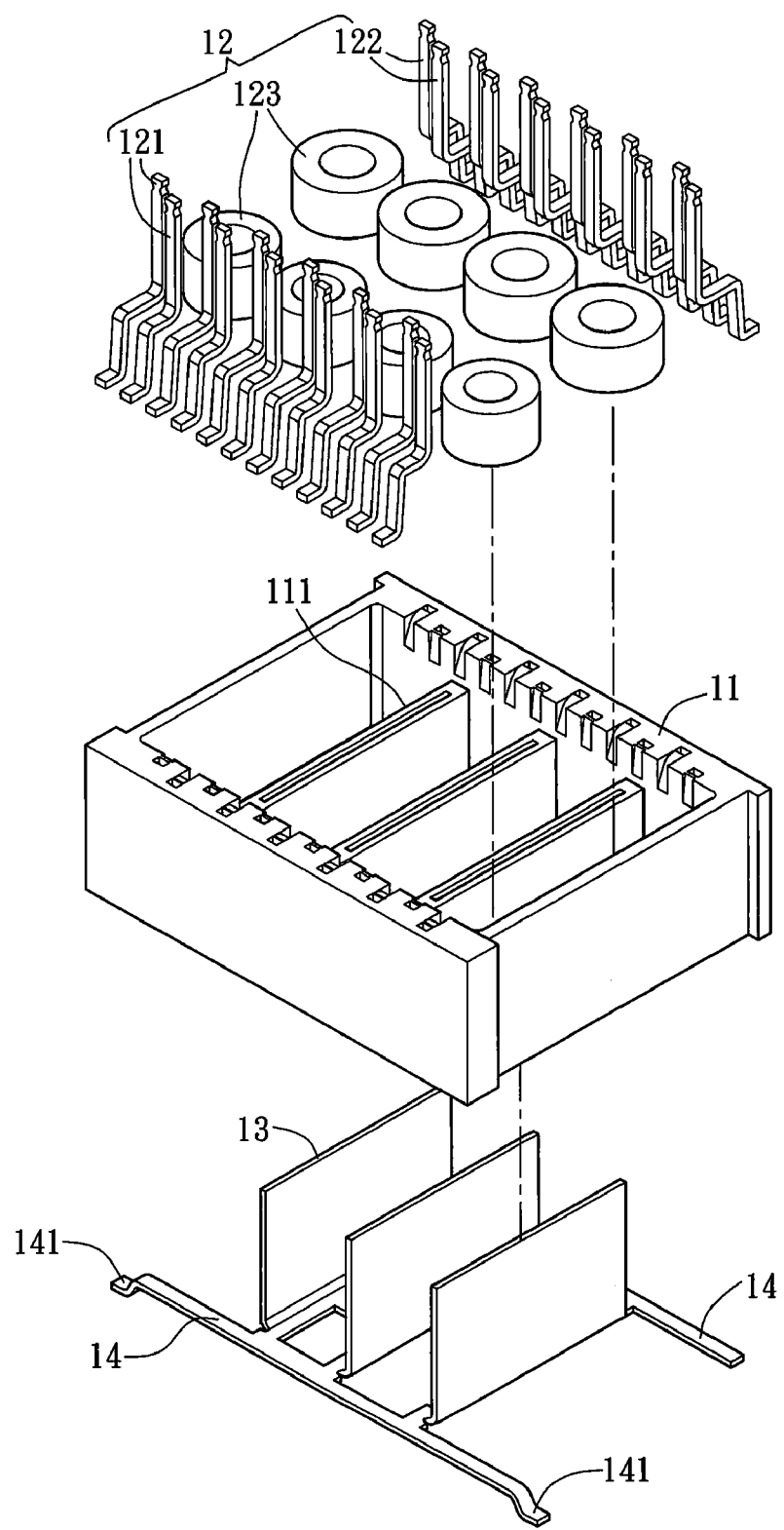

FIG. 1A shows a network communication component 1 according to the first embodiment of the invention, and FIG. 1B is an exploded view thereof.

The network communication component 1 can be a network filtering component, a network connector or other electronic components applied to network communication. In this embodiment, the network communication component 1 is a network filtering component as an illustrative example. The network communication component 1 includes a case 11, a plurality of channels 12 and at least one shielding 13.

The case 11 can be designed in various shapes, materials or types depending on the requirement of end products. The channels 12 are formed in the case 11 for transmitting signals. A pin, a filtering element, a passive device, an active device or other electronic devices can be disposed in the channel 12 for signal transmission. The network communication component 1 further includes pins 121, 122 and a plurality of filtering elements 123. Two pins 121 for signal output and two pins 122 for signal input are disposed in one of the channels 12. Alternatively, the pins 121 and the pins 122 can be served as signal input and signal output, respectively. The pins 121 and 122 are disposed at two opposite sides of the case 11, respectively, corresponding to the filtering elements 123. Alternatively, one or more pins can be disposed in the channel 12. The pair of pins can be used to transmit differential signals. The pin can be L-shaped or gull-wing-shaped structure protruded from the case (see FIG. 1A or FIG. 1B).

In this embodiment, the network communication component 1 has 24 pins, among which 16 pins are used in four channels and other pins can be used for grounding or receiving a reference voltage. The above is an example for illustration, and the network communication component 1 can have other amount of pins.

Here, two filtering elements 123 are disposed in each of the channels 12 as an example. The filtering element 123 includes a metal core wound with a coil for converting energy or filter signals.

The shielding 13 is disposed between two adjacent channels 12. The shielding 13 can be made of conductive material, such as metal, alloy or conductive polymer. The shielding 13 has a sheet shape or an irregular shape, or has a bent portion or a curved portion, depending on the design space occupied by the channel 12. Because of the shielding effect caused by the shielding 13, mutual interferences between the channels can be avoided to enhance signal transmission quality. The shielding 13 of the embodiment is mainly used to shield the filtering elements 123 of two adjacent channels 12, thereby eliminating the mutual interferences from the filtering elements 123. In addition, the amount of the shieldings 13 can be varied depending on the amount of the channels 12. In this embodiment, there are totally four channels 12, so there are three shieldings 13 disposed between the channels 12.

The case 11 has at least one partition 111 to separate the channels 12. The partition 111 can have a hole, and the shielding 13 can be inserted in the hole or disposed in the hole by embedding or injection molding. Of course, the shielding 13 can be coupled to the partition 111 in various ways, such as welding, adhering, wedging, embedding or injection molding.

The network communication component 1 can further have a connection element 14 connected with the signal shielding component 13. Here, the connection element 14 is stick-shaped, and there are two connection elements 14 disposed at two sides of the shieldings 13, respectively. The shielding 13 and the connection element 14 can be formed as one monolithic piece, wedged to each other, adhered to each other or welded to each other. In this embodiment, the shielding 13 and the connection element 14 are formed as a single piece by stamping, and then connected with the case 11 by embedding or assembling. In other words, the shielding 13 and the connection element 14 can be at least partially embedded in the case 11, or be assembled with the case 11 after formed individually. As mentioned above, the connection element 14 can make the shielding 13 more functional. In addition, the connection element 14 can have a grounding portion 141 disposed at one end of the connection element 14. The grounding portion 141 protrudes out of the case 11, and can be connected to a circuit board B. As the grounding portion 141 is connected to the circuit board B for grounding, both of the shielding 13 and the network communication component 1 are grounded so as to produce better shielding effect. Of course, the shielding 13 can be grounded by various ways, such as by contacting with the case 11 or other grounding points.

Besides, a signal circuit is disposed on the circuit board B, and the pins for signal input in the channel are electrically connected with the corresponding pins for signal output in the channel through the signal circuit.

Figure 2A:
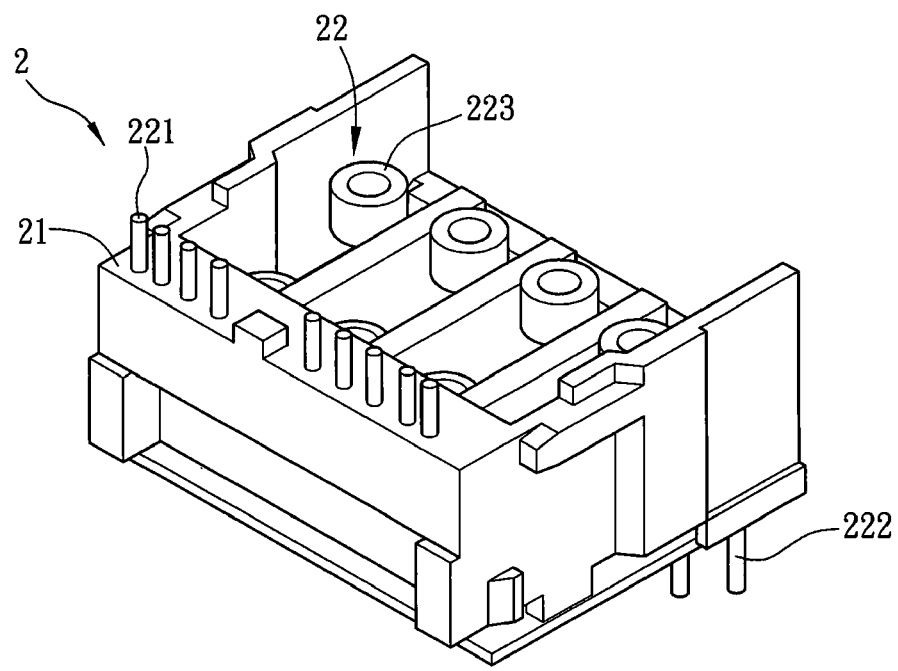
FIGS. 2A to 2C are schematic views of network communication component according to another embodiment of the invention.
Figure 2B:
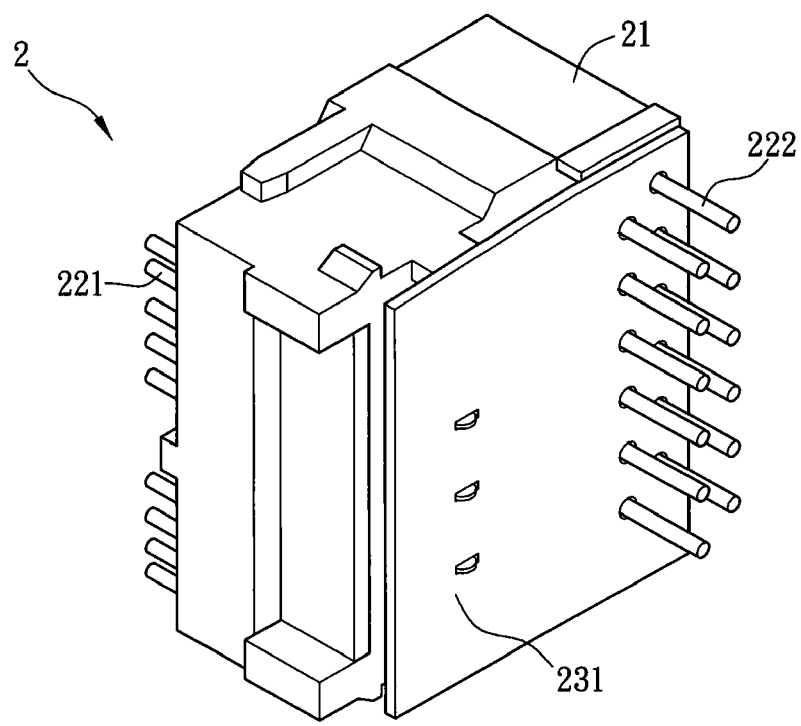
Figure 2C:
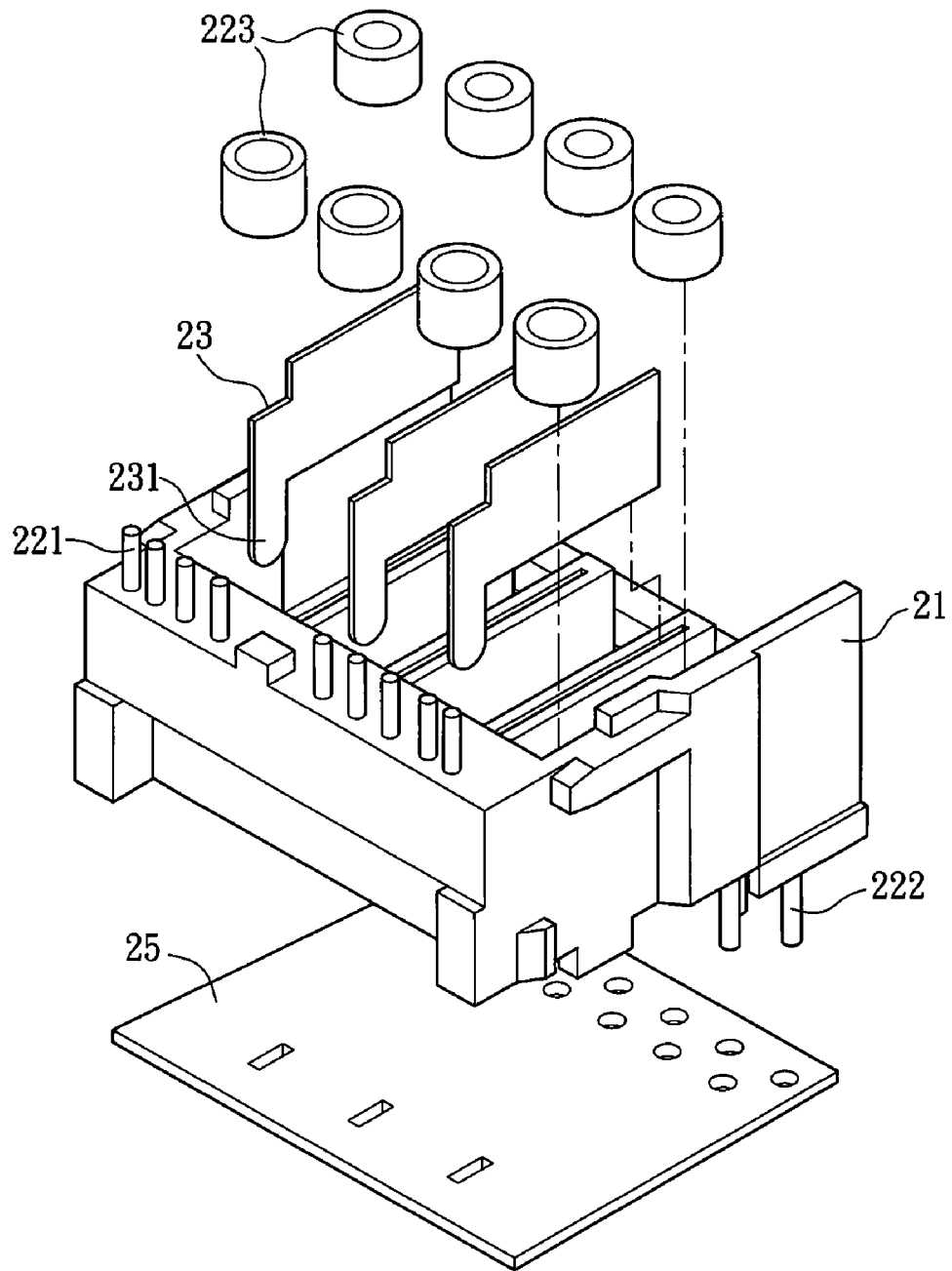

FIG. 2A shows the second embodiment of the network communication component 2 according to the invention. The network communication component 2, for example, is a network connector, such as RJ-45, RJ-14 or other connectors with different specifications. FIG. 2B is a schematic diagram viewed by a different angle from FIG. 2A, and the bottom of the network communication component 2 is shown in FIG. 2B, while FIG. 2C is an exploded view.

The network communication component 2 includes one or more pin(s) 221, 222, one or more filtering element(s) 223 and a circuit board 25. The pins 221, 222 are electrically connected to the signal circuit on the circuit board 25. The pins 221, 222 in different channels are separated by the shielding 23. The case 21 is coupled with the shielding 23 by embedding or assembling. In other words, the shielding 23 can be at least partially embedded in the case 21, or be assembled with the case 21 after being fabricated individually.

The difference between the network communication components 1 and 2 is that the shielding 23 of the network communication component 2 does not have the connection element. In other words, the shieldings 23 are separate as shown in FIG. 2C. In addition, the shielding 23 has a grounding portion 231 protruded out of the case 21 and electrically connected with the circuit board 25 for grounding. The grounding portion 231 can be wedged or welded to the circuit board 25 so as to strengthen the connection.

In summary, by disposing the shielding between two adjacent channels, the network communication component of the invention can avoid mutual interferences between channels to enhance signal transmission quality and product competiveness.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A network communication component comprising:
a case;
a plurality of channels formed in the case; and
at least one shielding disposed between two adjacent channels,
wherein the case has at least one partition to separate the channels,
wherein the shielding is coupled with the partition by welding, adhering, wedging, embedding or injection molding.

2. The network communication component of claim 1, further comprising at least one pin and a filtering element.

3. The network communication component of claim 2, wherein the pin is L-shaped or gull-wing-shaped.

4. The network communication component of claim 2, wherein the filtering element comprises a metal core wound with a coil for converting energy or filter signals.

5. The network communication component of claim 1, wherein the partition has a hole, and the shielding is inserted in the hole.

6. The network communication component of claim 1, further comprising a connection element for being connected to the shielding.

7. The network communication component of claim 6, wherein the shielding and the connection element are formed as one monolithic piece, wedged to each other, adhered to each other, welded to each other or formed by stamping.

8. The network communication component of claim 6, wherein the case is connected with the shielding and the connection element by embedding or assembling.

9. The network communication component of claim 6, wherein the connection element has a grounding portion protruded out of the case and electrically connected with a circuit board.

10. The network communication component of claim 1, wherein the shielding has a grounding portion protruded out of the case and electrically connected with a circuit board.

11. The network communication component of claim 10, wherein the grounding portion is wedged or welded to the circuit board.

12. The network communication component of claim 1, wherein the case is connected with the shielding by embedding or assembling.

13. The network communication component of claim 1, wherein the network communication component is a network filtering element, a network connector or an electronic device applied to network communication.

14. The network communication component of claim 1, wherein there is a pin, a filtering element, a passive device, an active device or their combination disposed in the channel.

15. The network communication component of claim 1, wherein the shielding is made of metal, alloy or conductive polymer.

16. The network communication component of claim 1, wherein the shielding has a sheet shape or an irregular shape, or has a bent portion or a curved portion.

17. The network communication component of claim 1, wherein the shielding contacts with the case or a grounding point.

18. A network communication component comprising:
a case;
a plurality of channels formed in the case; and
at least one shielding disposed between two adjacent channels,
wherein the case has at least one partition to separate the channels,
wherein the partition has a hole, and the shielding is inserted in the hole.

* * * * *